United States Patent [19]
Gobrecht

[11] 4,373,809
[45] Feb. 15, 1983

[54] SOLAR ENERGY FLUX INTEGRATOR

[76] Inventor: Klaus Gobrecht, Marinesteig 42, 1000 Berlin 38, Fed. Rep. of Germany

[21] Appl. No.: 114,006

[22] Filed: Jan. 21, 1980

[30] Foreign Application Priority Data

Jun. 20, 1979 [DE] Fed. Rep. of Germany ....... 2925382

[51] Int. Cl.³ .......................... G01J 1/44; G01J 1/48
[52] U.S. Cl. ................................................. 356/215
[58] Field of Search ........................ 356/215; 324/94

[56] References Cited

U.S. PATENT DOCUMENTS

| 2,286,036 | 6/1942 | Lamb | 356/215 |
| 3,045,178 | 7/1962 | Corrsin | 324/94 |
| 3,344,343 | 9/1967 | John | 324/94 |
| 3,390,576 | 7/1968 | Yellot | 73/170 |

*Primary Examiner*—Bruce Y. Arnold
*Attorney, Agent, or Firm*—Jordan and Hamburg

[57] ABSTRACT

A solar energy flux integrator includes a semiconducting solar cell positioned to receive solar radiation, and a micro-coulombmeter connected to receive current from the solar cell. The micro-coulombmeter comprises a glass capillary filled with a mercury salt electrolyte having an indicating bubble and two mercury electrodes. A series resistor is provided which has a resistance value to slow the movement of the bubble when low levels of solar energy are incident on the cell so that movement of the bubble is directly proportional to the incident solar flux. This series resistor compensates for the spectral shift towards blue of the indirectly received solar radiation, which spectral shift otherwise causes the measured integrated value of solar flux to be too high due to the greater sensitivity of the solar cell to light of shorter wavelengths. A parallel resistor is provided to scale the output of the solar cell to the Micro-Coulombmeter and a reversing switch is connected to permit travel of the indicating bubble in opposite directions.

8 Claims, 3 Drawing Figures

SOLAR ENERGY FLUX INTEGRATOR

BACKGROUND OF THE INVENTION

This invention relates to an instrument for measuring the time integral of the solar energy flux falling on a flat surface. The integrator integrates the direct and diffuse radiation power of solar energy impinging on the instruments front plane.

An integrating device of this type is useful for solar energy applications since the solar energy falling on a flat surface depends not only on the geographical location and the direction of the incoming radiation, but also to a large extent upon the weather conditions, the environment (such as mountains, trees, snow, water, and pollution), as well as the state of the collecting surface. Some of these parameters may also change continuously with time (seasons etc.).

It is very difficult if not impossible to take into account all these parameters for computing the correct energy input from the rare existing "hours of sun" data; consequently, there is need for a solar energy flux integrator which can be used in exactly the same way, and as easily, as the numerous rain gauges distributed all over the world.

Conventional solar energy meters and integrators, such as pyrhelio-meters and integrating pyranometers, are very precise, costly instruments which need skilled technicians for reading and service. They are heavy, bulky, devices and need power supplies.

SUMMARY OF THE INVENTION

Briefly stated, in accordance with the invention, a semiconducting solar cell is mounted to receive solar radiation, and connected to apply current to a micro-coulombmeter. The micro-coulombmeter is preferably in the form of a glass capillary filled with a mercury salt electrolyte and containing two mercury electrodes, so that the mercury is transported by current applied thereto from the positive to negative pole. This results in the migration of the electrolyte to the positive pole. The resultant migration of the electrolyte bubble is directly proportional to the current, and can be measured. Linear display with respect to solar flux can be effected by the suitable selection of series and shunt resistors.

In a modification of the invention, a reversing switch may be provided, to reverse the connections of the micro-coulombmeter, thereby to reverse the direction of migration of the bubble.

The instrument of the invention ensures at any moment and immediately the direct reading of the integrated solar energy flux without the use of any ancillary power or special readout devices. It is precise, weatherproof, light, cheap, and can be used for many years.

BRIEF DESCRIPTION OF THE DRAWINGS

In order that the invention will be more clearly understood, it will not be disclosed in greater detail with reference to the accompanying drawings, wherein.

DETAILED DISCLOSURE

Figure 1:
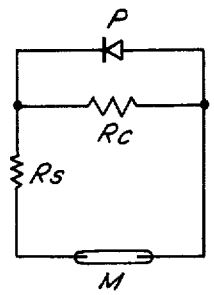
FIG. 1 is a simplified circuit diagram of one embodiment of a solar energy flux integrator in accordance with the invention.
Figure 2:
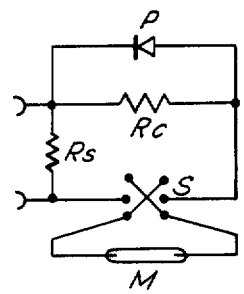
FIG. 2 is a circuit diagram of a modification of the circuit of FIG. 1.

Referring now to FIG. 1, a semiconducting solar cell p, such as a silicon p-n junction silicon solar cell, is mounted to receive solar energy flux, the cell being connected by way of series resistor $R_s$ to a micro-coulombmeter M. A parallel resistor $R_c$ is connected in parallel with the solar cell. As will be discussed in greater detail in the following paragraphs, the micro-coulombmeter is preferably in the form of a glass capillary having mercury electrodes and a mercury salt electrolyte. In the resulting structure, current through the micro-coulombmeter results in the moving of mercury from the positive to the negative poles, and hence the migration of the electrolyte to the positive pole. The migrating bubble may be observed, and its position indicated by a suitable scale on the capillary. This movement provides an indication of the solar energy flux falling on the solar cell. Since, after a time, the bubble will have moved to its full extent in one direction, a reversing switch S may be provided, as shown in FIG. 2, to permit the periodic reversal of direction of movement of the bubble.

In order to simplify the explanation of the invention, the following symbols and units are employed in this disclosure:

Symbols and Units Used in This Disclosure i electrical current
dt differential time interval
$i_c$ short circuit current
$R_s$ series resistance
$R_c$ shunt resistance
$R_i$ internal resistance
$\Omega$ Ohm (1.k$\Omega$ = 1000$\Omega$)
$\mu$A Microampere ($= 10^{-6}$A $= 10^{-3}$ mA)
mV Millivolt ($= 10^{-3}$ V)
kW Kilowatt ($= 1000$ W $= 3413$ Btu/h)
h hour
m meter ($= 39.37$ inches)
AMU air mass unit (standard solar energy flux unit on earth (about 1 kW/m$^2$)

Working Principle of the Invention

The solar energy flux integrator of the invention uses a p-n junction (e.g. a silicon solar cell) as the radiation sensitive surface. The current output from the junction electrolyses mercury in a capillary filled with an aquous mercury salt solution and two mercury electrodes. The electrolytic solution forms a small (~1 mm), distinct, transparent bubble, whose movement is limited on both ends by the mercury electrodes. The current i applied to the electrodes makes the bubble migrate because mercury is ionized on the positive (+) electrode, goes into solution and is deposited on the negative (−) electrode. The bubble migrates to the positive pole at a rate directly proportional to the applied current. When the current is high (bright sunshine) the bubble moves fast, when it is small (dim light), the bubble moves slowly.

The distance travelled for a given time (e.g. one day is proportional to the time integral of the current ($\int i dt$) during that time. If, for instance, the current is high for one hour, the distance travelled is the same as for five times less current during a period of five hours.

The above described device is a form of the well known Micro-Coulombmeter used by electro-chemists, since it measures electrical charge (unit μAh). For the purpose of the invention it is now necessary to establish the conditions under which the current integral is proportional to the integrated solar energy flux, in other words, how the current in the Micro-Coulombmeter can be made proportional to the incoming solar energy flux.

Solar cell p-n junctions have an output current proportional to the incoming radiation under the following conditions:

the voltage across the junction must be less than half the open circuit voltage the shunt resistance must be constant the temperature of the junction must be constant the spectral distribution of the incoming radiation must be the same at all intensities.

The last condition is important because the spectral response of solar cell junctions is not flat, for example, for indirectly received solar radiation. The average wavelength of radiation received on the ground from the bright sun at noon is shifted to the red end of the spectrum as compared with the average wavelength of the diffuse radiation through clouds. If this effect is not taken into account, the measuring error can be as much as 20%.

The present invention compensates for this effect almost entirely by using the following concept:

The solar cell can be calibrated for global radiation at just 1 AMU (about 1 kW/m$^2$). Lower intensities are normally due to a more or less overcast sky and/or a lower elevation of the sun. In both cases the diffuse part of the radiation predominates, and the center of the spectral distribution shifts slightly to the blue. Schematically one can say that at high intensities (bright sun) the solar cell gives the correct current, and at lower intensities (haze, clouds, low sun) the current is too high by a value that may be as much as 20% at the lowest intensities.

In order to linearize the output of the solar cell junction it is thus necessary to provide an intensity dependant variable resistance. The invention does exactly that in the following way:

If, as stated above, the Micro-Coulombmeter bubble travels at a speed proportional to the applied current, it does not travel proportionally for an applied voltage. At low voltages the internal resistance of an electrochemical Micro-Coulombmeter is voltage dependant, and the voltage versus current characteristic is not a straight line. At zero current the internal resistance $R_i$ is about three times higher than at high currents. This effect is used in my invention to linearize the output of the solar cell. The solar cell is shunted by a small resistance $R_c$, giving a small voltage drop proportional to the current output of the cell. This voltage is applied to the Micro-Coulombmeter with a high resistance $R_s$ in series. The sum of the internal resistance plus the series resistance $(R_i + R_s)$ is voltage dependant. A small voltage gives a current too small in the Micro-Coulombmeter, because its resistance is higher than normal for small voltages. Since, as was shown above, the voltage across the solar cell is enhanced for low radiation intensities due to the shift in the spectral distribution, the current depletion in the Micro-Coulombmeter for these voltages finally produces a nearly perfect compensation. The degree of compensation is given by the ration $(R_s + R_i)$. By choosing the right value for this ratio, the current through the Micro-Coulombmeter becomes directly proportional to the incoming energy flux for practically all intensities, even though the voltages across the solar cell and the Micro-Coulombmeter are relatively too high at low intensities. The schematic diagram showing the linearization network is represented in FIG. 1.

In order to illustrate the operation of the Solar Energy Flux Integrator assuming the full scale deflection of the Micro-Coulombmeter (i.e. the maximum distance the bubble can travel one way) will take at least one month, and knowing that in summer in Europe at 50° latitude one month may yield an integrated energy flux of 280 kWh/m$^2$, one can calculate the flux sensitivity the Micro-Coulombmeter should have. If its full scale deflection corresponds to 6.48 mAh (the calibration constant of the Micro-Coulombmeter), its flux sensitivity should be $6480/280 = 23$ μAm$^2$/kW. A $2 \times 2$ cm$^2$ silicon solar cell delivers a short circuit current of 100 mA for an energy flux of 1 kW/m$^2$ (at 1 AMU conditions). Its flux sensitivity is therefore 100 mAm$^2$/kW. This value is 4321 times the Micro-Coulombmeter sensitivity, and the ratio of the series to shunt resistance values $(R_s + R_i)/R_c$ should thus be made equal to 4321.

By comparing the voltage characteristics of both the silicon solar cell and the 6.18 mAh Micro-Coulombmeter, one finds the total series resistance $(R_s + R_i)$ to be 9800Ω for optimum linearization. The shunt resistance $R_c$ is then $9800/4321 = 2.3Ω$. The internal resistance of the 6.48 mAh Micro-Coulombmeter is $R = 600Ω$, and $R_s$ becomes $9800 - 600 = 9200Ω$. With these resistance values and the given flux sensitivities a solar energy flux of 1 kW/m$^2$ generates a voltage of 230 mV across $R_c$, and the bubble migrates at a rate of 0.09 mm/h (the length of the capillary being 25.4 mm = 1 inch).

In a preferred example of the invention, the Micro-Coulombmeter capillary has, like conventional thermometer capillaries, an asymmetric cross section to provide a lens effect for more easily distinguishing the bubble. The bubble contains a piece of fluorescent colored plastic which floats in the electrolytic solution and moves with it. Behind the capillary there is a scale 25 mm long. Thin wires enter each end of the capillary to intimately contact the mercury electrodes. The ends of the capillary are well sealed with silicon rubber to prevent any leakage of mercury. A reversing switch can be inserted in the circuit of FIG. 1. This switch enables the change of polarity of the voltage across the Micro-Coulombmeter, when the bubble has reached the positive end of the capillary and seeks to travel out of view. Reversing the switch about once a month enables the Solar Energy Flux Integrator to be used for many years. The modified wiring diagram is shown in FIG. 2.

The instrument allows the calculation of the total solar energy flux collected between two dates of observation by multiplying the distance the bubble has travelled by a calibration constant.

Figure 3:
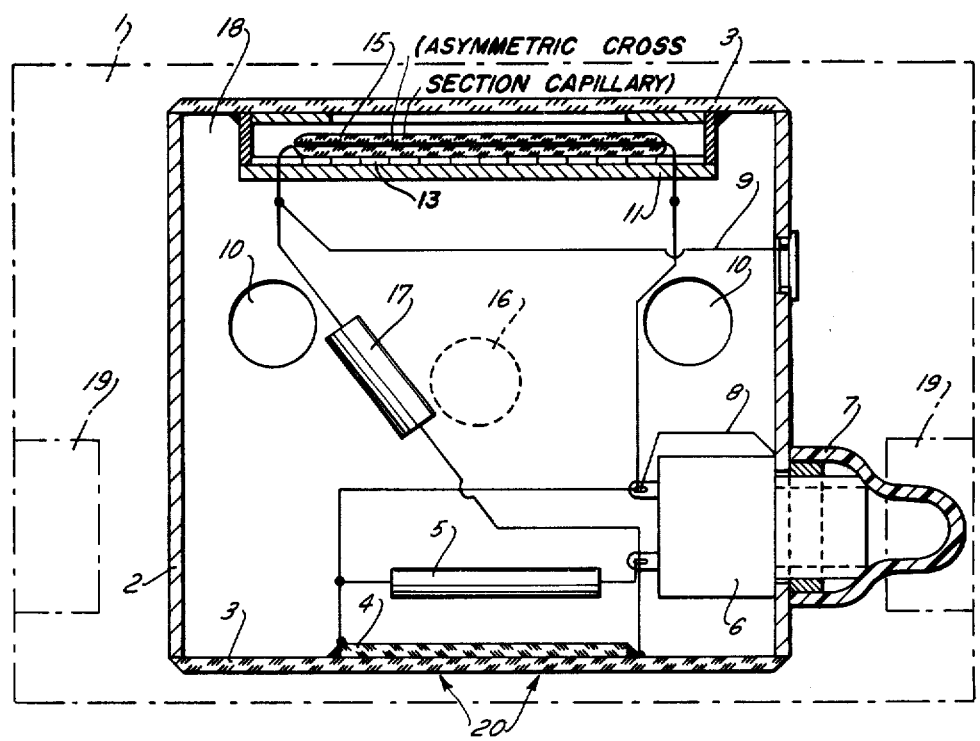
FIG. 3 is a simplified cross sectional view of a structure of an integrating solar energy flux apparatus in accordance with the invention.

As shown in FIG. 3, the different components forming the integrator circuit, i.e. the solar cell 4, the Micro-Coulombmeter 11, the reversing switch 6 and the linearization network consisting of shunt resistor 5 and series resistor 17 are preferably housed in a weatherproof, highly light reflecting case 2 with windows 3,3 at opposite faces. The solar cell 4 is glued to the window facing the sun, and the Micro-Coulombmeter is glued to the window facing away from the sun. The weatherproof case 2 sits in a cradle 1 of any convenient construction, which can be orientated to the desired position to permit optimum reception of sunlight. The lever of the reversing switch is automatically actuated each time the case is turned around in the cradle to reverse the direction of travel of the bubble. By this means the bubble (not shown) always travels from left to right. The components inside the case are protected from moisture and shock by filling the case with a polymerizing plastic 18.

An insulated wire 9 coming out of the case enables the precise final cailbration of the instrument.

FIG. 3 further illustrates the provision of a cover 7 on the switch 6, for maintaining the weatherproof characteristics of the device. If desired, a ground wire 8 may be connected between the case 2 and a point in the electric circuit. It is to be noted that the connections to the switch in FIG. 3 are shown from one view only, the switch actually being electrically connected as shown in FIG. 2. FIG. 3 further shows an engraved scale 13. The device may be provided with holes 10 extending therethrough, to enable fixing the device to the cradle 1 by conventional means, for example, screws or the like. The representation of the cradle 1 includes internal projections 19 positioned so that the switch is automatically operated upon each reversal of the device in the cradle. As a result, the bubble may be caused to reverse its direction of movement automatically upon periodic servicing of the device. The dotted circle 16 depicts a support rod for supporting the cradle 1. The reference numeral 20 depicts the light falling in the silicon solar cell 4.

The calibration lead 9 enables the connection of en external resistance between the circuit and the ground point, following the encapsulation of the device, for calibration purposes.

While the invention herein has been disclosed and described with reference to a single embodiment, it will be apparent that variations and modifications may be made therein, and it is intended in the following claims to cover each such variation and modification as falls within the true scope of the invention.

What is claimed is:

1. An apparatus for integrating solar energy flux on a plane surface comprising a semiconducting solar cell for receiving a solar energy flux, an electrochemical Micro-Coulombmeter connected to receive current from said solar cell, said Micro-Coulombmeter comprising a glass capillary filled with a mercury salt electrolyte having a bubble therein and the capillary containing two mercury electrodes, whereby current-through said Micro-Coulombmeter results in the transportation of said mercury from the positive to negative pole and the migration of electrolyte to the positive pole, and a resistor connected in series with said Micro-Coulombmeter and having a value to slow the movement of said bubble sufficiently when low levels of said solar energy flux are incident on said cell so that said movement is directly proportional to said incident solar energy flux.

2. The apparatus of claim 1 further comprising a resistance connected in parallel with the series combination of said series resistor and said Micro-Coulombmeter for enabling direct proportionality between the indication of said Coulombmeter and direct solar energy flux falling on said solar cell.

3. The apparatus of claim 5 wherein said glass capillary has a scale thereon, and has an asymmetric cross section to provide a lens effect for viewing the electrolyte.

4. The apparatus of claim 3 wherein said bubble includes a piece of fluorescent colored insoluble plastic to enable greater contrast in the indication of said Micro-Coulombmeter.

5. The apparatus of claim 2 further comprising a reversing switch connected to enable reversing the direction of current flow in said Micro-Coulombmeter upon reversing said switch.

6. The apparatus of claim 2 further comprising a highly reflective casing enclosing said solar cell and Micro-Coulombmeter, whereby the temperature of said device is maintained at a low degree.

7. The apparatus of claim 2 wherein said semiconducting solar cell comprises a silicon p-n junction solar cell.

8. The apparatus of claim 1 further comprising a parallel resistor connected in parallel with the series combination of the series resistor and the micro-Coulombmeter, said series and parallel resistors having values to provide a current through the micro-Coulombmeter that is directly proportional to said incident solar energy flux falling on said solar cell for substantially all intensities of light.

* * * * *